(12) United States Patent
Sears et al.

(10) Patent No.: US 8,816,267 B2
(45) Date of Patent: Aug. 26, 2014

(54) DC BIAS EVALUATION IN AN AC COUPLED CIRCUIT VIA TRANSIENT GAIN RESPONSE

(75) Inventors: Walter J. Sears, Westford, MA (US); Aaron B. Johnson, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 509 days.

(21) Appl. No.: 13/377,849

(22) PCT Filed: Apr. 8, 2011

(86) PCT No.: PCT/US2011/031687
§ 371 (c)(1),
(2), (4) Date: Dec. 13, 2011

(87) PCT Pub. No.: WO2011/127348
PCT Pub. Date: Oct. 13, 2011

(65) Prior Publication Data
US 2012/0091325 A1 Apr. 19, 2012

(51) Int. Cl.
*G01R 19/00* (2006.01)
*H03F 3/08* (2006.01)

(52) U.S. Cl.
CPC .................................. *H03F 3/08* (2013.01)
USPC ............................................. 250/214 R

(58) Field of Classification Search
USPC ......... 250/214 R, 214.1; 324/123 R; 398/202, 398/208, 212
See application file for complete search history.

(56) References Cited

U.S. PATENT DOCUMENTS

| | | | |
|---|---|---|---|
| 8,050,573 B2 * | 11/2011 | Zhang | 398/202 |
| 2003/0072073 A1 | 4/2003 | Domagala et al. | |
| 2006/0016894 A1 | 1/2006 | Matsumoto | |
| 2009/0196632 A1 * | 8/2009 | Zhang | 398/202 |
| 2009/0236502 A1 | 9/2009 | Ishii | |
| 2009/0238582 A1 * | 9/2009 | Tsunoda et al. | 398/208 |
| 2009/0243729 A1 | 10/2009 | Gao et al. | |

* cited by examiner

*Primary Examiner* — Seung C Sohn
(74) *Attorney, Agent, or Firm* — Daniel J. Long; Maine Cernota & Rardin; Andrew P. Cernota

(57) ABSTRACT

A method and system are provided for the monitoring of direct current bias, the system including switching an amplifier of known scale factor from low to high; monitoring a step change in bias generated by the gain change; measuring, the response to the bias change via appropriate peak detection logic; and determining the amount of bias present at an input based on AC response and the amplifier scale factor.

15 Claims, 3 Drawing Sheets

DC BIAS EVALUATION IN AN AC COUPLED CIRCUIT VIA TRANSIENT GAIN RESPONSE

STATEMENT OF GOVERNMENT INTEREST

The invention was made with United States Government support under Contract No. W31P4Q-06-C-0330 awarded by the Navy. The United States Government has certain rights in this invention.

RELATED APPLICATIONS

This application claims the benefit of U.S. Provisional Application No. 61/321,914, filed Apr. 8, 2010. This application is herein incorporated by reference in their entirety for all purposes.

FIELD OF THE INVENTION

The invention relates to DC Bias evaluation, and more particularly, to a system and method for monitoring DC Bias in an AC coupled circuit via transient gain response.

BACKGROUND OF THE INVENTION

In a digital signal processing circuit the later gain stages are typically alternating current (AC) coupled to maximize the signal dynamic range at the analog to digital converter (ADC). There are situations where the direct current (DC) signal level after the first gain stage needs to be evaluated. If that DC bias is allowed to reach the limits of the circuit (voltage rail) it will result in signal corruption and the AC response will not be valid. Typically gain transients are not useful since the circuit is settling from one quiescent state to another and need to be ignored. Using gain characteristics of the first gain stage allows a transition from high to low gain to generate a bias change (known transient behavior). This transition is seen as a step response to the AC circuit and the AC response can be evaluated to determine the bias present at the input to the AC coupled circuitry (verify no signal corruption).

What is needed, therefore, are techniques for determining that the input bias levels are not close to the voltage rails at the input to an AC coupled system to avoid signal corruption. Typical solutions involve the addition of monitoring circuitry that measures the DC bias directly. This requires additional circuitry and ADC inputs which are not cost effective in a product that is already in production or applications that have limited board area.

SUMMARY OF THE INVENTION

One embodiment of the present invention provides a method for the monitoring of direct current bias, the system comprising: switching an amplifier of known scale factor from low to high; monitoring a step change in bias generated by the gain change; measuring, the response to the bias change via appropriate peak detection logic; and determining the amount of bias present at an input based on AC response and the amplifier scale factor Another embodiment of the present invention provides such method wherein the amplifier is a trans-impedance amplifier.

A further embodiment of the present invention provides such method wherein the amplifier has a scaling factor of 23×.

One embodiment of the present invention provides a method for detecting output bias levels of a sensor, the method comprising: receiving a output bias level from the sensor; amplifying the output of the sensor with an amplifier with high and low gain options with a known amplifier scale factor; switching the amplifier from a low gain state to a high gain state; monitoring an AC response to the change in DC level that results from the switching of the gain state; and computing a DC bias based on the AC response and the amplifier scale factor Another embodiment of the present invention provides such method wherein the output bias level is from background noise in the environment.

A further embodiment of the present invention provides such method wherein the output bias level is from the sun in a field of view of the sensor Still another embodiment of the present invention provides such method wherein the sensor comprises at least one avalanche photodiode.

A still further embodiment of the present invention provides such method wherein the amplifier comprises at least one trans-impedance amplifier.

Yet another embodiment of the present invention provides such method wherein the amplifier has a scaling factor of 23×.

A yet further embodiment of the present invention provides such method, further comprising where the AC signal exceeds a desired value, decreasing an operating voltage to a bandwidth value.

One embodiment of the present invention provides a system for the monitoring of sun in field of view of an avalanche photodiode unit, the system comprising: an avalanche photo diode receiving optical signals from an optical lens; an amplifier configured for operation at least a high gain and a low gain; peak detectors identifying the peaks in an AC signal generated by transition of the DC signal between high and low gain.

Another embodiment of the present invention provides such system wherein the amplifier is a variable gain amplifier.

A further embodiment of the present invention provides such system wherein the amplifier is a trans-impedance amplifier.

Still another embodiment of the present invention provides such system further comprising a second amplifier.

A still further embodiment of the present invention provides such system wherein the second amplifier is a variable gain amplifier.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1 is a block diagram illustrating an overview of a method of DC bias evaluation in an AC coupled circuit via transient gain response configured in accordance with one embodiment of the present invention applied to sun in field of view of an avalanche photodiode (APD) based system.

FIG. 2 is a line chart illustrating a graph of a method of DC bias evaluation in an AC coupled circuit via transient gain response configured in accordance with one embodiment of the present invention applied to sun in field of view of an APD based system.

FIG. 3 is a flow chart for a method of evaluation in an AC coupled circuit via transient gain response configured in accordance with one embodiment of the present invention applied to sun in field of view of an APD based system

DETAILED DESCRIPTION

Figure 1:
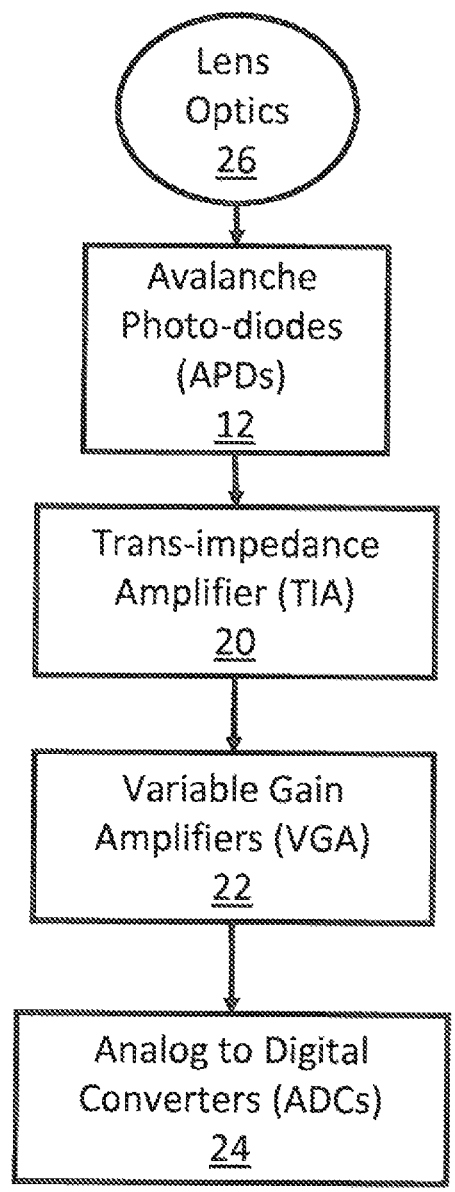

As illustrated in FIG. 1, a method for DC bias evaluation in an AC coupled circuit via transient gain response, configured according to one embodiment of the present invention, is provided. In such a method, avalanche photodiodes (APDs) 12 receive photonic energy 14 and generate an output current 16. The avalanche photo diode generates a DC current level 18 based on the amount of background energy received by the avalanche photodiode 12. A trans-impedance amplifier 20 is used to convert the DC current level 18 into a voltage level. The trans-impedance amplifier (TIA) 20 of one embodiment of the present invention had high and low gain options and a 23× scale factor between the two settings. The TIA may then be transitioned from low to high gain via the appropriate control circuitry. The output from the TIA 20 is, in one embodiment may be further amplified with variable gain amplifiers 22 and converted from analog to digital by an analog to digital converter 24.

In one embodiment of the present invention the TIA gain stage was transitioned from a LOW to HIGH gain configuration to generate a DC bias shift with a known 23× scale factor. This bias shift is viewed as a step response to the AC coupled circuitry and peak detection logic was used to find the maximum value from the resulting waveform. The magnitude of the waveform is directly related to the amount of DC bias voltage and can be used to avoid operating conditions (like Sun in FOV for APDs) that would damage performance. In some embodiments of the present invention, this involves determine a maximum level of DC bias at which the AC signals will not reach the voltage rail at the input to the AC coupled circuitry. Identification of a high bias level allows the first gain stage to be adjusted back to a level to avoid corruption and/or the reporting of the error.

Figure 2:
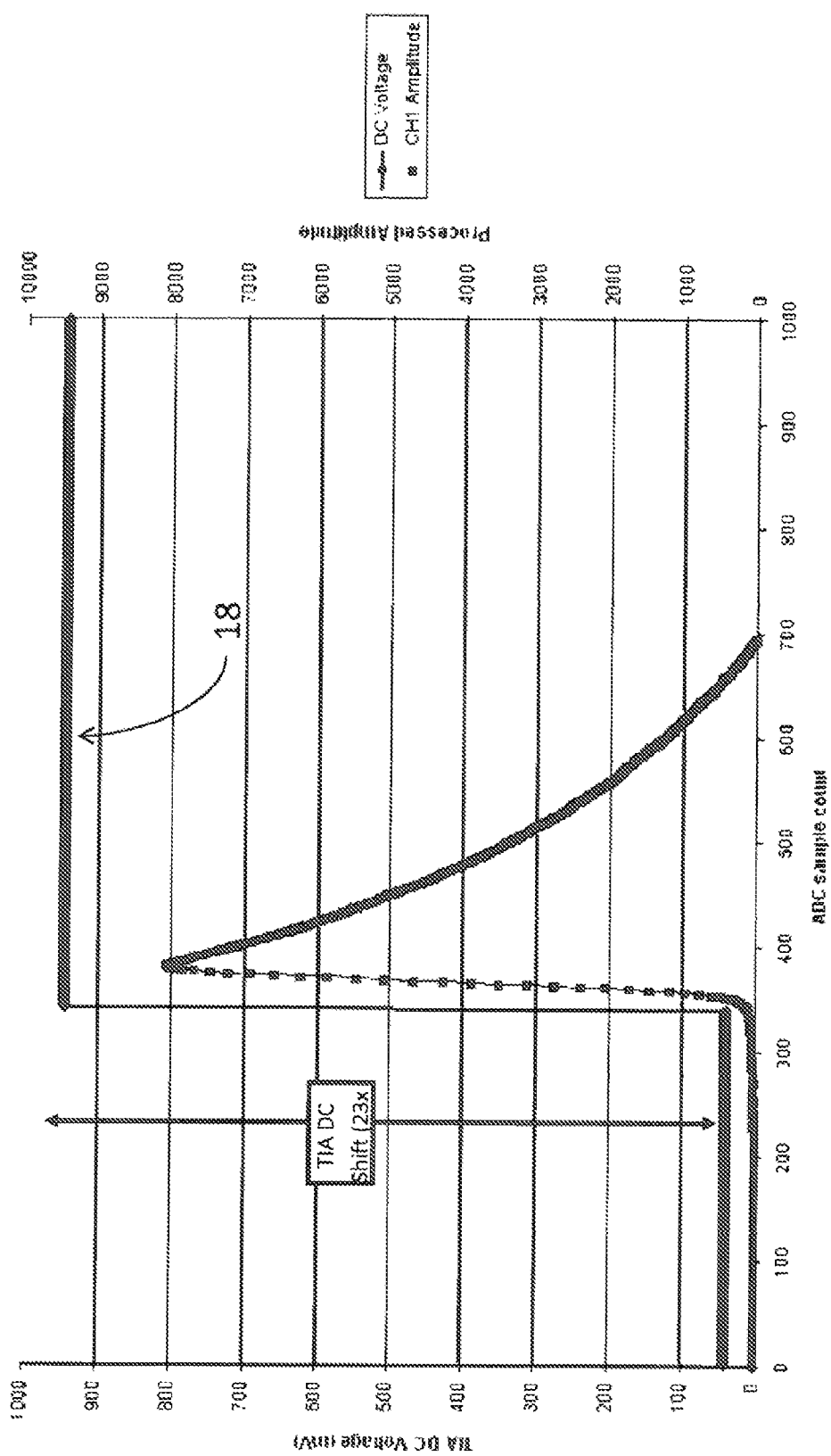

One embodiment of the present invention was implemented in an optical system to detect the presence of high background noise/Sun in field of view. Avalanche photodiodes (APDs) 12 received the photonic energy from lens optics 26 and generated an output current. The APD 12 generates a DC current level based on the amount of background energy received by the APD 12. The trans-impedance amplifier (TIA) 20 converted the current from the APD 12 into a voltage level. The TIA 20 had two gain options (High and Low) which had a 23× scale factor. Transitioning the TIA 20 from low to high gain generates a step response as illustrated in FIG. 2. The gains of the later stages were then applied to the measured response to determine the amount of DC bias at the output of the TIA.

Switch TIA From LOW to HIGH (VGA=35)

The DC level will change from "small" to "large" and will look like an instantaneous AC signal.

The magnitude of the resulting AC signal will measure the DC voltage delta between TIA Low and TIA High.

This transition with the AC coupling will cause a "pulse" that can be detected via normal peak-detection logic.

Data has been collected to validate this transition. The measurement data was within 1 percent of the predicted response (based on filter responses of the later gain stages).

As illustrated in Table 1, a test was performed wherein a spot light was used to simulate the effect of sun in the field of view of the detector. Different DC bias levels were generated. Bias levels for 7 channels were reported, allowing for evaluation of the measurements provided by the system and systemic reaction.

TABLE 1

| Mode | Flags | TIA | Gain | Bias1 | Bias2 | Bias3 | Bias4 | Bias5 | Bias6 | Bias7 | Spot Light |
|---|---|---|---|---|---|---|---|---|---|---|---|
| Night | 0x20 | High | 204 | 447 | 250 | 291 | 810 | 66 | 308 | 216 | Off |
| Day | 0x00 | High | 76 | 3842 | 605 | 1130 | 942 | 1089 | 586 | 518 | Dim, 4 feet away |
| SFOV | 0x10 | Low | 180 | 7940 | 1500 | 2574 | 2113 | 2465 | 1401 | 1288 | Bright, 4 feet away |
| SFOV | 0x10 | Low | 184 | 4588 | 862 | 1628 | 1257 | 1266 | 655 | 651 | Dim, ⁻3 feet away |
| SFOV | 0x10 | Low | 188 | 4485 | 880 | 1530 | 1101 | 1158 | 653 | 693 | Dim, ⁻3.2 feet away |
| Partial SFOV | 0X00 | High | 112 | 4345 | 764 | 1424 | 1094 | 1177 | 633 | 628 | Dim, ⁻3.4 feet away |

Figure 3:
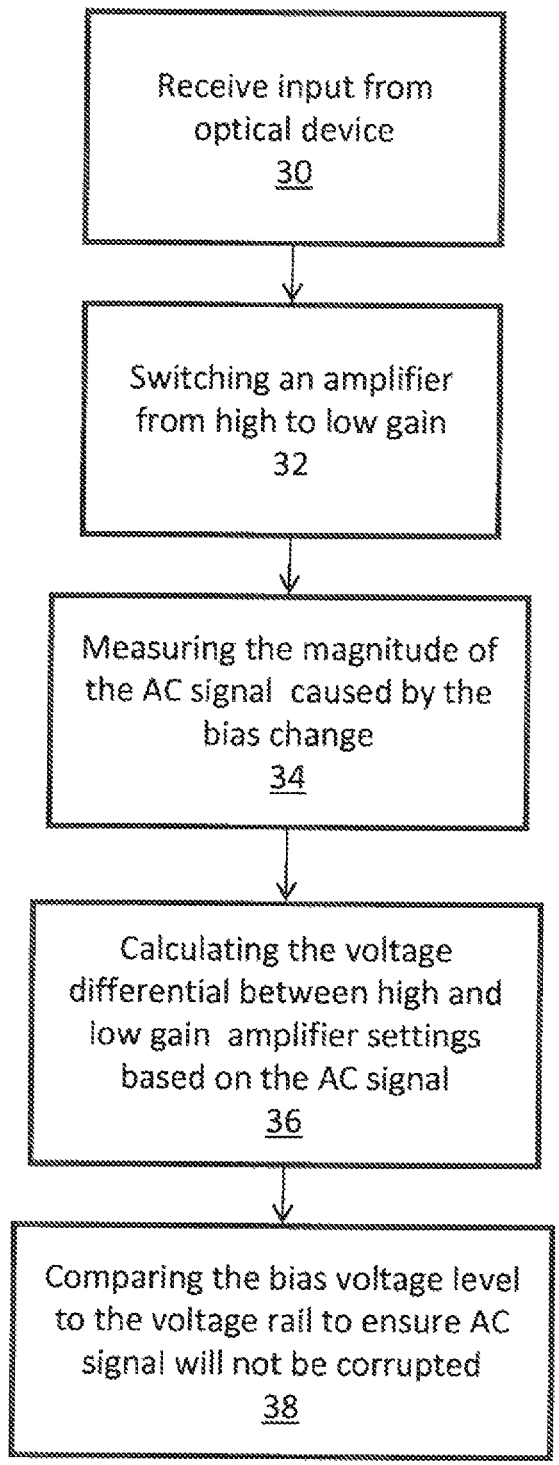

As illustrated in FIG. 3 a signal is received by the avalanche photodiode system 30. An amplifier is switched from a high gain to a low gain level 32, the transition between high and low gain reveals a DC voltage differential that over a short or instantaneous sample period resembles a AC signal, the magnitude of which can be measured 34. The voltage differential between the high and low gain settings can then be calculated 34 from the AC signal magnitude. Pulses in the AC signal are detected over time with peak detection logic and the bias voltage level is compared to the voltage rail to ensure AC signal will not be corrupted 38. When the signal exceeds the threshold, automatic adjustments may be made to the operating voltage of the system to prevent saturation due to background noise. In instances where the signal saturation is high, the system may be configured to decrease $V_{op}$ to the bandwidth value and re-evaluate (Partial SFOV mode, TIA goes HIGH) and if the saturation persists, the amplifier stays set to LOW and $V_{op}$ stays at the bandwidth value (Full SFOV mode).

One embodiment of the present invention provides a method for the monitoring of direct current bias, the system comprising: switching an amplifier 20 of known scale factor from low to high 32; monitoring a step change in bias generated by the gain change; measuring, the response to the bias change via appropriate peak detection logic 34; and determining the amount of bias present at an input based on AC response and the amplifier 20 scale factor 38. In one such embodiment the amplifier 20 is a trans-impedance amplifier 20. Likewise, in one embodiment, the amplifier 20 has a scaling factor of 23×.

One embodiment of the present invention provides a method for detecting output bias levels of a sensor, the method comprising: receiving a output bias level from the sensor 30; amplifying the output of the sensor 12 with an amplifier 20 with high and low gain options with a known amplifier scale factor and switching the amplifier 20 from a low gain state to a high gain state 32; monitoring an AC response to the change in DC level that results from the switching of the gain state 36; and computing a DC bias based on the AC response and the amplifier 20 scale factor 38.

Such a method could be utilized where output bias level is from background noise in the environment or from the sun in a field of view of the sensor. The sensor 12 may be at least one avalanche photodiode, and the amplifier 20 may be at least one trans-impedance amplifier or may have a scaling factor of 23×.

Where the AC signal exceeds a desired value, the method may include decreasing an operating voltage to a bandwidth value.

One embodiment of the present invention provides a system for the monitoring of sun in field of view of an avalanche photodiode unit, the system comprising: an avalanche photo diode 12 receiving optical signals from an optical lens 26; an amplifier 20 configured for operation at least a high gain and a low gain; peak detectors identifying the peaks in an AC signal generated by transition of the DC signal between high and low gain.

Another embodiment of the present invention provides such system wherein the amplifier 20 is a variable gain amplifier or a trans-impedance amplifier. In an alternative embodiment of the present invention a second amplifier 22 may be provided which may be a variable gain amplifier.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for the monitoring of direct current bias, the system comprising:
    switching an amplifier of known scale factor from low to high;
    monitoring a step change in bias generated by said gain change;
    measuring, the response to said bias change via appropriate peak detection logic; and
    determining the amount of bias present at an input based on AC response and the amplifier scale factor.

2. The method of claim 1 wherein said amplifier is a trans impedance amplifier.

3. The method of claim 1 wherein said amplifier has a scaling factor of 23×.

4. A method for detecting output bias levels of a sensor, said method comprising:
    receiving a output bias level from said sensor;
    amplifying the output of said sensor with an amplifier with high and low gain options with a known amplifier scale factor;
    switching said amplifier from a low gain state to a high gain state;
    monitoring an AC response to the change in DC level that results from said switching of said gain state; and
    computing a DC bias based on said AC response and said amplifier scale factor.

5. The method of claim 4 wherein said output bias level is from background noise in the environment.

6. The method of claim 4 wherein said output bias level is from the sun in a field of view of the sensor.

7. The method of claim 5 wherein said sensor comprises at least one avalanche photodiode.

8. The method of claim 4 wherein said amplifier comprises at least one trans-impedance amplifier.

9. The method of claim 4 wherein said amplifier has a scaling factor of 23×.

10. The method according to claim 9, further comprising where said AC signal exceeds a desired value, decreasing an operating voltage to a bandwidth value.

11. A system for the monitoring of sun in field of view of an avalanche photodiode unit, said system comprising:
    an avalanche photo diode receiving optical signals from an optical lens;
    an amplifier configured for operation at least a high gain and a low gain;
    peak detectors identifying the peaks in an AC signal generated by transition of the DC signal between high and low gain.

12. The system according to claim 11 wherein said amplifier is a variable gain amplifier.

13. The system according to claim 11 wherein said amplifier is a trans-impedance amplifier.

14. The system of claim 11 further comprising a second amplifier.

15. The system of claim 14 wherein said second amplifier is a variable gain amplifier.

* * * * *